United States Patent
Nichols et al.

(10) Patent No.: US 9,415,349 B2
(45) Date of Patent: Aug. 16, 2016

(54) POROUS MEMBRANE PATTERNING TECHNIQUE

(71) Applicant: General Electric Company, Schenectady, NY (US)

(72) Inventors: Jason Michael Nichols, Schenectady, NY (US); Matthew Jeremiah Misner, Delanson, NY (US); Hongyi Zhou, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 279 days.

(21) Appl. No.: 14/194,340

(22) Filed: Feb. 28, 2014

(65) Prior Publication Data

US 2015/0246327 A1    Sep. 3, 2015

(51) Int. Cl.
| | | |
|---|---|---|
| *B05D 3/00* | (2006.01) | |
| *B05D 3/04* | (2006.01) | |
| *B29C 37/02* | (2006.01) | |
| *B01D 39/00* | (2006.01) | |
| *B01D 69/12* | (2006.01) | |
| *B01D 67/00* | (2006.01) | |
| *B29C 39/00* | (2006.01) | |
| *B29C 39/02* | (2006.01) | |
| *B29C 39/44* | (2006.01) | |
| *B29C 67/00* | (2006.01) | |
| *G05B 15/02* | (2006.01) | |
| *G03F 7/00* | (2006.01) | |
| *B01D 69/02* | (2006.01) | |
| *B01D 69/06* | (2006.01) |

(Continued)

(52) U.S. Cl.
CPC .............. *B01D 69/12* (2013.01); *B01D 67/00* (2013.01); *B01D 69/02* (2013.01); *B01D 69/06* (2013.01); *B01D 71/12* (2013.01); *B29C 39/003* (2013.01); *B29C 39/026* (2013.01); *B29C 39/44* (2013.01); *B29C 67/0048* (2013.01); *G03F 7/0002* (2013.01); *G05B 15/02* (2013.01); *B01D 2325/08* (2013.01); *B29K 2001/18* (2013.01); *B29K 2105/04* (2013.01); *B29L 2031/755* (2013.01)

(58) Field of Classification Search
CPC .............. B01D 69/02; B01D 2325/08; B01D 67/0062; B01D 67/0069; B01D 39/1692; B01D 71/40; B29C 65/008
See application file for complete search history.

(56) References Cited

U.S. PATENT DOCUMENTS

| | | | |
|---|---|---|---|
| 5,736,188 A | 4/1998 | Alcock et al. | |
| 5,753,014 A * | 5/1998 | Van Rijn ............ | B01D 39/1692 55/524 |

(Continued)

OTHER PUBLICATIONS

Malik, "Porous adhesive technology for diagnostic applications", IVD Technology—Feature Articles, Mar. 1, 2009.

(Continued)

*Primary Examiner* — Ana Fortuna
(74) *Attorney, Agent, or Firm* — Pabrita K. Chakrabarti

(57) ABSTRACT

A porous membrane patterning technique is provided. In one embodiment, a porous membrane may be patterned via printing on the porous membrane with a solvent such that the porous membrane collapses where the solvent is applied. In another embodiment, a patterned porous membrane may be formed by casting a solution including at least components of the porous membrane into voids of a casting plate or stencil, removing the casting plate, and letting the remaining components go through a phase inversion process to form porous membrane regions.

6 Claims, 4 Drawing Sheets

(51) Int. Cl.
*B01D 71/12* (2006.01)
*B29K 1/00* (2006.01)
*B29K 105/04* (2006.01)
*B29L 31/00* (2006.01)

(56) References Cited

U.S. PATENT DOCUMENTS

| | | | |
|---|---|---|---|
| 6,074,725 A | 6/2000 | Kennedy | |
| 6,209,992 B1* | 4/2001 | Hashizume | B41J 2/14233 347/65 |
| 7,655,075 B2* | 2/2010 | Hofmann | B01D 67/0062 210/490 |
| 8,124,421 B2 | 2/2012 | Feaster et al. | |
| 2002/0113840 A1* | 8/2002 | Trauernicht | B41J 2/03 347/47 |
| 2003/0113528 A1 | 6/2003 | Moya | |
| 2005/0117005 A1* | 6/2005 | Fujii | B41J 2/1603 347/92 |
| 2005/0270312 A1* | 12/2005 | Lad | B41J 3/28 347/1 |
| 2007/0207518 A1* | 9/2007 | Motoyama | C12Q 1/04 435/34 |
| 2010/0159599 A1 | 6/2010 | Song et al. | |
| 2011/0123398 A1 | 5/2011 | Carrilho et al. | |
| 2013/0004668 A1* | 1/2013 | Sato | B41J 2/1603 427/259 |

OTHER PUBLICATIONS

Gantelius et al., "A lateral Flow Protein Microarray for Rapid Determination of Contagious Bovine Pleuropneumonia Status in Bovine Serum", Journal of Microbiological Methods, vol. 82, Issue 1, pp. 11-18, Jul. 2010.

Lu et al., "Fabrication and Characterization of Paper-Based Microfluidics Prepared in Nitrocellulose Membrane by Wax Printing", Analytical Chemistry, vol. 82, Issue 1, pp. 329-335, 2010.

Sharma et al., "Unconventional Low-Cost Fabrication and Patterning Techniques for Point of Care Diagnostics", Annals of Biomedical Engineering, vol. 39, Issue 4, pp. 1313-1327, Apr. 2011.

* cited by examiner

POROUS MEMBRANE PATTERNING TECHNIQUE

BACKGROUND

The subject matter disclosed herein relates to porous membranes, such as nitrocellulose membranes, and, more particularly, to the formation of patterns on and with such membranes.

Porous membranes may be used as substrate materials for assays, including medical assays or environmental assays. For example, a porous membrane may include some or all of the assay components, e.g., antibodies or binding agents, that react with a sample and provide an output. In the example of a pregnancy test, the porous material is placed in contact with the sample fluid, which may then flow laterally along the porous membrane to contact the assay materials disposed on or within the porous membrane. Depending on the presence or absence of a particular compound, such as hCG, the sample will react with the assay components in the porous membrane to provide different visual outputs, depending on if the sample is from a pregnant or non-pregnant patient. In such an example, the assay components are arranged along the lateral flow path of the porous membrane. For more complicated assays, more complex flow paths and patterns may be involved. However, such patterns may be difficult to form, particularly in repeating patterns on larger sheets that are subsequently cut into single strips for individual use.

BRIEF DESCRIPTION

In one embodiment, system for patterning a porous membrane, is provided. The system includes a memory or storage device storing processor-executable instructions that, when executed by a processor, cause acts to be performed comprising: receiving an input corresponding to a desired pattern; and controlling a printer to apply a solvent to a surface of a porous membrane in the desired pattern such that the porous membrane collapses where the solvent is applied; and a processor configured to execute the instructions stored in the memory or storage device. The system also includes and a printer comprising a solvent application device configured to hold solvent and apply the solvent to the porous membrane in the desired pattern under control of the processor.

In another embodiment, a method for patterning a porous membrane is provided that includes receiving an input comprising a pattern; and controlling a printer to apply a solvent to a surface of a porous membrane in the desired pattern such that the porous membrane collapses where the solvent is applied.

In another embodiment, a method for patterning a porous membrane is provided that includes providing a casting solution comprising components that, when cast, form a porous membrane; applying the casting solution to a casting plate comprising a plurality of voids (e.g., in discrete or continuous formats), wherein the casting plate is positioned proximate to a substrate such that the casting solution directly contacts the substrate when applied within the voids; removing the casting plate; and allowing the casting solution to undergo a phase inversion process to form porous membrane regions only on portions of the substrate.

In another embodiment, a porous membrane is provided that comprises a repeating pattern printed on the porous membrane, wherein the repeating pattern comprises a repeat of an enclosed flow area bounded by a collapsed region of the porous membrane, wherein the collapsed region has a thickness of 0.02 mm to 0.35 mm in at least a portion of the collapsed region, and wherein the collapsed region is sufficiently collapsed to prevent a flow of fluid outside of the enclosed flow area.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Porous membranes such as nitrocellulose membranes may be used for nucleic acid, protein, or other compound detection in diagnostic applications, e.g., food borne pathogen testing, medical testing, and drugs of abuse screening. Provided herein are methods for printing complex flow paths onto porous membranes that allow complex testing workflows to be translated to a lateral flow format. In certain implementations of the disclosed techniques, porous membranes with complex flow paths may be formed by selectively collapsing the membrane with solvent in the desired pattern. In another implementation, porous membranes may be formed by depositing membrane casting solution in the desired pattern or structure that facilitates the controlled deposition of regions with different size, morphology and/or chemistry. The porous membranes formed herein may have surface structures with 3D patterning at resolutions of 10-100 microns. Such fine detailing permits more complex flow pathways on the porous membranes that in turn allow more complex diagnostic tests to be performed in a cost-effective manner. The simple manufacturable preparation of custom flow paths in a lateral flow membrane is particularly beneficial for single-use, disposable testing implementations of complex testing work flows, such as nucleic acid testing.

Figure 1:
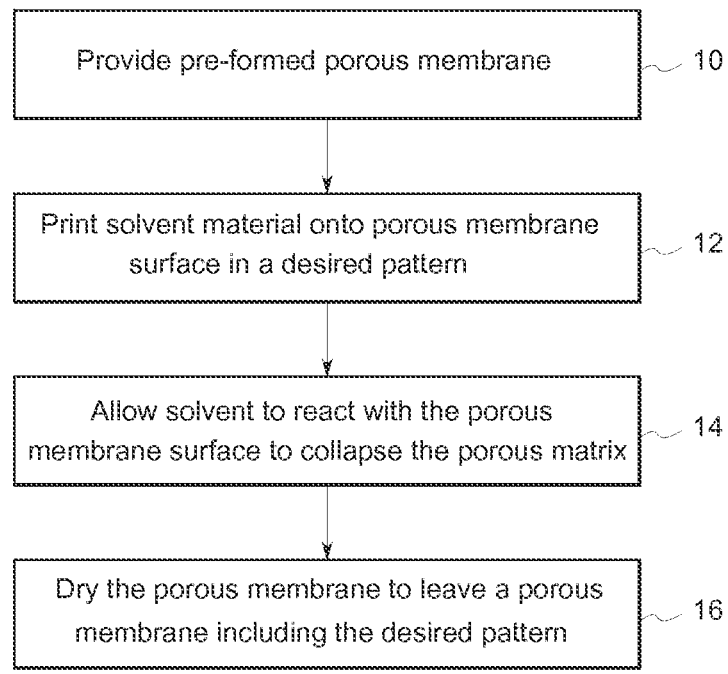
FIG. 1 is a flow diagram of a solvent printing technique for porous membranes according to an embodiment of the disclosure.

FIG. 1 is a flow diagram of one such technique for forming a desired pattern on a porous membrane. According to one embodiment, the printed porous membranes may be formed by modifying a preformed membrane. To that end, at step 10, the method includes providing such a pre-formed membrane. In embodiments of the present disclosure, the pre-formed porous membrane may include nylon, paper, fiberglass, cellulose, polyethylene, polyolefin, polyacrylamide, or nitrocellulose membranes. However, it should be understood that these are non-limiting examples of porous membranes. For example, the pre-formed membrane may be formed as a membrane sheet. Further, the porous membrane may be formed in any suitable arrangement, including test strips for single step testing, sheets including a plurality of single strips, etc. In addition, the pre-formed membrane may have any desired porosity and/or pore size according to its end use, e.g., the assay parameters, manufacturing considerations, etc. In certain exemplary embodiments, the porous membrane may have a nominal pore size of 0.1 micrometer or greater, or 0.1 micrometer to 5 micrometers. The pre-formed membrane may also have a thickness selected to achieve a desired tensile strength and signal visibility. At step 12, the porous membrane is exposed to a solvent applied in a desired pattern such that the membrane porous matrix collapses locally at step 14, and, upon drying, leaves a region in the desired pattern at step 16 that produces a boundary for capillary flow in the membrane. That is, there is no flow in the collapsed region, and the collapsed region or regions form barriers to flow. Conversely, the uncollapsed or unprinted areas of the porous membrane permit fluid flow.

The solvent may be any suitable solvent, such as an organic solvent or an ester-based solvent. In one embodiment, a volatile solvent may be used to facilitate rapid drying. The solvent may include, for example, one or more solvents such as solvents chosen from ketones, esters, ethers, hydrocarbons, and mixtures thereof. However, it should be understood that these are non-limiting examples of solvents that may be used in conjunction with the present techniques. Examples of such solvents may include one or more of methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

In certain embodiments of the disclosure, printing may refer to contacting the porous membrane with the solvent. The solvent may be applied by any suitable printing method, without limitation, including manual application (e.g., via a syringe or stylet), stamping, gravure, piezoelectric, flexographic, pad, or inkjet printing. However, in particular embodiments, using a mechanized printer under processor-based control may permit finer pattern resolution relative to manual applications. For example, it is envisioned that the patterns as disclosed herein may define flow paths having a particular resolution in the micron scale, e.g., 100 microns or less.

Figure 2:
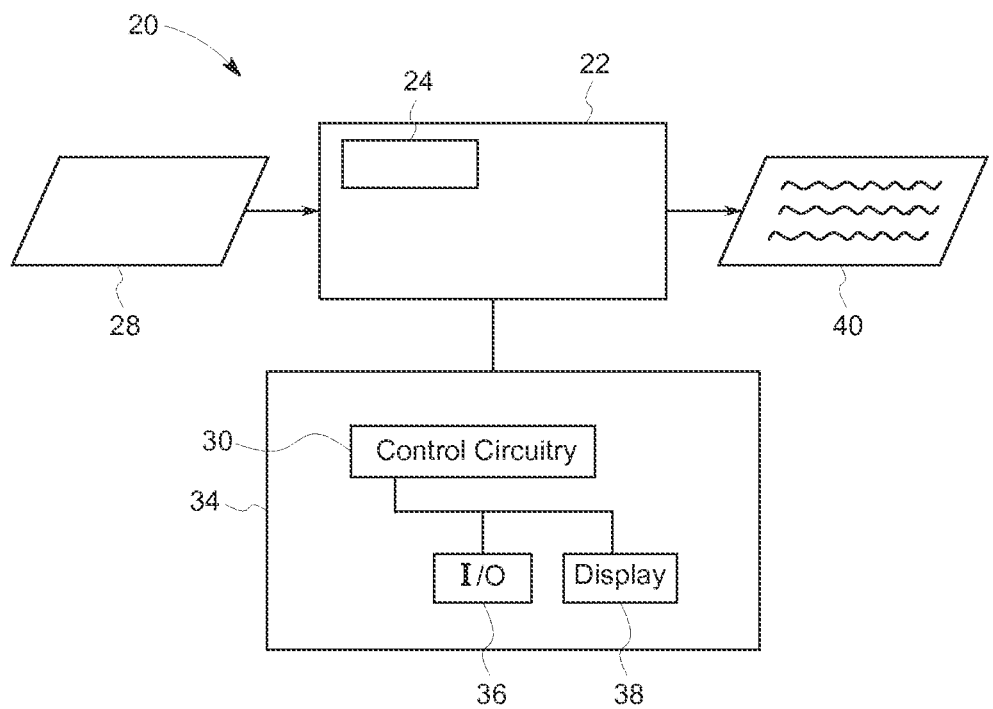
FIG. 2 is a block diagram of a printing system that may perform the technique of FIG. 1 according to an embodiment of the disclosure.

FIG. 2 is a block diagram of a printing system 20 that may be used in conjunction with the method of FIG. 1. The system includes a printer 22 with a device that holds a printing fluid, such as a printer cartridge 24 for dispensing the solvent onto the pre-formed porous membrane 28. The printer 22 operates under the control of system control circuitry 30. In certain embodiments, the printer 22 may be a commercially available printer. In such embodiments, the cartridge 24 may be implemented to operate in conjunction with the printer 22. The system control circuitry 30 may include a wide range of circuits, such as timing circuits, circuits for dispensing solvent from the cartridge 24 in conjunction with movement of the porous membrane 28, circuits for controlling the position of the porous membrane 28 and advancing the porous membrane 28 through the printer 22. In the present context, the system control circuitry 30 may also include computer-readable memory elements, such as magnetic, electronic, or optical storage media, for storing programs and routines executed by the system control circuitry 30 or by associated components of the system 20. The stored programs or routines may include programs or routines for performing all or part of the present technique.

An operator workstation 34 including the control circuitry 30 may be housed within the printer 22 or may be within a separate device. Regardless of whether the control circuitry 30 is within the printer 22, the system 20 may include additional processor-based components, various memory and/or storage components including magnetic and optical mass storage devices, internal memory, such as RAM chips. The memory and/or storage components may be used for storing programs and routines for performing the techniques described herein that are executed by the operator workstation 34 or by associated components of the system 20. Alternatively, the programs and routines may be stored on a computer accessible storage and/or memory remote from the printer 22 or the workstation 34 but accessible by network and/or communication interfaces present on the system 20. The computer 24 may also comprise various input/output (I/O) interfaces 36, as well as various network or communication interfaces. The various I/O interfaces may allow communication with user interface devices, such as a display 38, keyboard, mouse, etc., that may be used for viewing and inputting configuration information and/or for operating the system 20. The various network and communication interfaces may allow connection to both local and wide area intranets and storage networks as well as the Internet. The various I/O and communication interfaces may utilize wires, lines, or suitable wireless interfaces, as appropriate or desired.

In one embodiment, an operator may provide inputs to the printer 22 to specify the desired pattern for the porous membrane. Accordingly, the system 20 may be configured to store and execute software that facilitates drawing or pattern creation by the operator. Such software may include graphics software such as Adobe Illustrator, available from Adobe System Incorporated (San Jose, Calif.) or CorelDRAW® from Corel Corporation (Ottawa, Calif.). The workstation 34 may be configured with the appropriate processing circuitry for such software. In another embodiment, the operator may select from one or more stored patterns or flow paths. For example, an operator may select a particular flow path associated with a desired assay type. In addition, the operator may select a pattern, but customize its size and/or length to the resolutions permitted by the printer 22 to quantify certain features of flow path to achieve a desired result, such as assay time, desired assay component loading amount, desired sample loading amount, etc. After receiving the instructions from the control circuitry 30, the printer can apply the solvent in the desired pattern and to modify the pre-formed porous membrane 28 to yield a patterned porous membrane 40.

Figure 3:
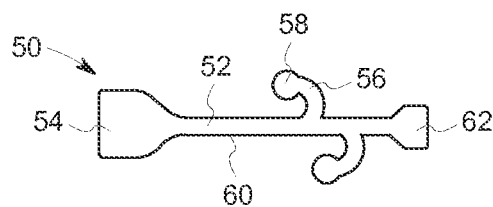
FIG. 3 is an example of a complex flow path of a porous membrane formed by solvent printing according to an embodiment of the disclosure.
Figure 4:
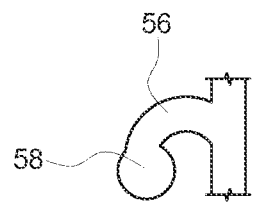
FIG. 4 is a detail view of the flow path of FIG. 3.
Figure 5:
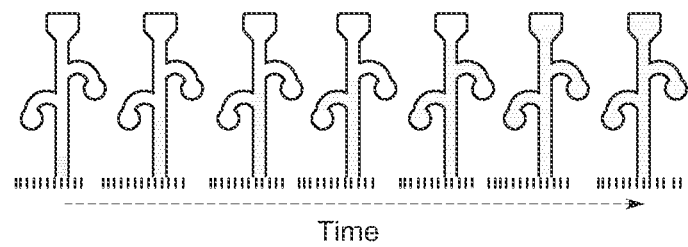
FIG. 5 is flow of dye through the flow pattern of FIG. 3.

Shown in FIGS. 3-5 is an example of a patterned porous membrane. In the depicted example, methylacetate was printed onto a PET-backed nitrocellulose membrane with an inkjet printer (Dimatix DMP-2800, Fujifilm USA) using a 10 picoliter drop-size cartridge with a drop spacing of 10 microns. Other printing technologies selected without limitation from offset, gravure, pad, screen, intaglio, and flexography can also be used. FIG. 3 and FIG. 4 show the patterned membrane including a pattern 50 with a defined flow area 52 and including a sample loading area 54 and arms 56 terminating in reservoirs 58. In the depicted embodiment, the pattern 50 defines a closed flow area 52, such that sample applied to the flow area 52 cannot flow outside of the flow area. A boundary line 60 of collapsed porous membrane surrounding the flow area 52 prevents lateral flow of the sample. The mechanized solvent drop spacing of the printer for the application of the solvent permits the boundary line 60 of the pattern 50 to be relatively small. For example, the boundary line 60 may be printed to the resolution of the printer. In one embodiment, the boundary line may be about 0.02 mm in thickness or greater. In another embodiment, the boundary line 60 may be about 0.35 mm in thickness, corresponding to a single point of line weight, or greater. Ranges of boundary line thickness of 0.02 mm-0.35 mm, 0.02 mm to 1 mm, and 0.35 mm-2 mm are also envisioned. The boundary line 60 may also vary in thickness within the pattern 50. Further, the defined flow area 52 may also include any desired shape or path of flow, including spiral paths, zig-zags, serpentine paths, closed loops, cloverleafs, etc. In one embodiment, a zig-zag or serpentine path may be used to slow lateral flow of a sample within the flow area 52. In another embodiment, separate channels or branches, such as the arms 56 and reservoirs 58 may include different assay components with different outputs. In this manner, a single pattern 50 may be capable of running multiple tests in parallel on one sample. Further, the various paths may be configured differently, i.e., one path may have a longer path, such as a serpentine configuration, relative to another path in the same flow area 52. Such an arrangement may permit fine tuning of various assay finish times within a single flow area 52. Depending on the arrangement of the assay, the beginning of the flow area 52 may include sample assay components common to all of the different tests. For example, the initial flow through the flow area 52 may result in sample contact with breakdown components such as cell lysis components or DNA cleavage enzymes that prepare the sample for contact with the specific binding proteins that may be present in each arm 54. Alternatively, the parallel tests may include controls or other quality assessments. The pattern 50 may also include a sample capture area 62 that may collect excess sample or may include assay components for an additional test.

FIG. 5 shows a flow path over time of a drop of dye that is deposited onto the patterned membrane (far left) and is eluted with water to split the dye into three compartments (right). Other patterns to control flow profiles, such as delaying, mixing, dispersing, etc. may be generated as well. For example, a pattern 50 may be generated that disperses a sample into separate arms that may meet at later junction after additional sample processing. In one embodiment, a signal generator in the sample capture area may be used to assess that the sample has flowed completely through the porous membrane.

Figure 6:
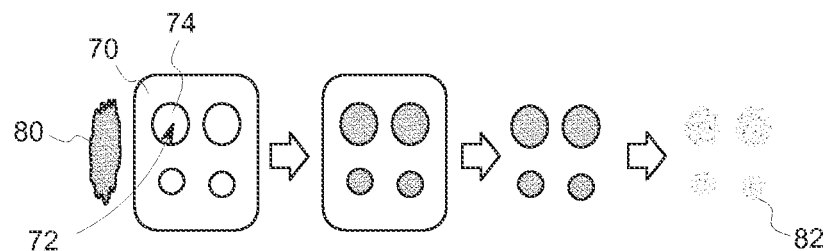
FIG. 6 is a schematic view of an additive printing with a stencil according to an embodiment of the disclosure.

Nitrocellulose membranes are, for example, membranes that may be formed through an evaporative phase inversion process. A patterned membrane may also be discretely deposited via printing techniques (e.g., stencil or screen printing) onto a casting surface, rather than coating the entire process web and subsequently patterning after a uniform porous membrane has been formed. This additive process facilitates geometries beyond a flat sheet for nitrocellulose or other porous membranes, e.g., multi-dimensional (2D and 3D) geometries that deviate from the flat sheet. FIG. 6 is a schematic diagram of a method of forming a porous membrane only on desired areas of a substrate. At the start, a casting plate 70 (e.g., a metal plate) is provided with a stencil of a pre-formed pattern including void or negative spaces 72 and is associated with or positioned proximate to a substrate 74 to provide a backing within the void 72. That is, the substrate 74 is exposed within the void. The substrate may be any suitable material, such as PET. The thickness of the casting plate may be selected according to the desired thickness of the porous membrane. The substrate 74 may be formed from a different material than the patterned porous membrane or the same material. Alternatively, the substrate may be relatively non-porous. In one embodiment, the substrate 74 is a porous membrane material itself, and the patterning technique forms layers or 3D porous geometries on a pre-formed porous membrane.

Casting solution 80 includes components for the formation of a porous membrane, which may include a polymer solution for phase inversion (e.g., a polymer, solvent and nonsolvent solution, that when cast, forms a suitable porous membrane), solvents, and pore forming additives. The casting solution 80 is applied over the casting plate 70 and voids 72 to directly contact the exposed substrate 74 and fill the voids 72. The plate 70 is then removed and phase inversion is allowed through evaporation of solvent. The result is a dried porous membrane region 82 that is only present in the areas of the substrate 74 corresponding to the locations of the voids 72. In this manner, specific regions 82 of porous membrane may be formed on the substrate 74. In certain embodiments, the regions 82 form a sample flow area.

Figure 7:
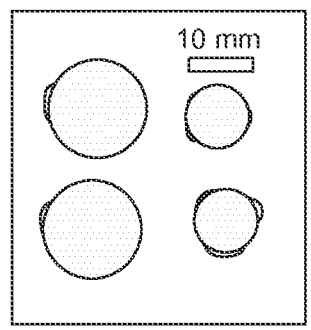
FIG. 7 shows an example of a stencil printed membrane.
Figure 8:
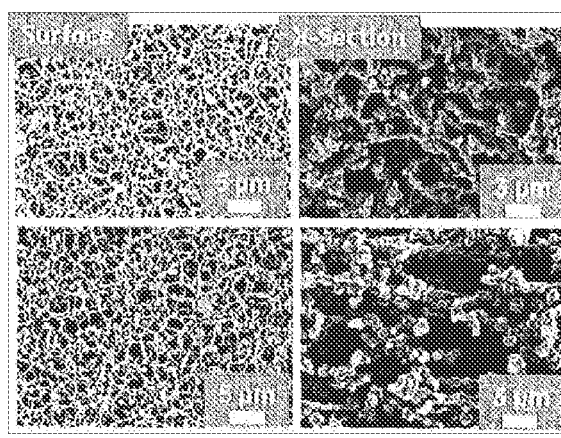
FIG. 8 is a comparison of morphology between commercially manufactured, flat sheet membranes and stencil printed membranes.

In FIG. 7, an example of a few circular patterns of different sizes is shown. A comparison in FIG. 8 of those membranes formed by this additive process (top panels) to flat sheet membranes (bottom panels) formed in a commercial process, shows that, although the process is constrained to the size and shape of the plate 70, the morphology of the membrane is comparable. The casting plate 70 may include a stencil in any suitable shape or pattern, and may include shapes of different sizes or configurations. In certain embodiments in which the substrate 74 is not porous and, accordingly, does not permit flow, the pattern of the stencil may define a flow area for fluid. In this manner, the porous membrane may be built only in areas where flow is desired.

Figure 9:
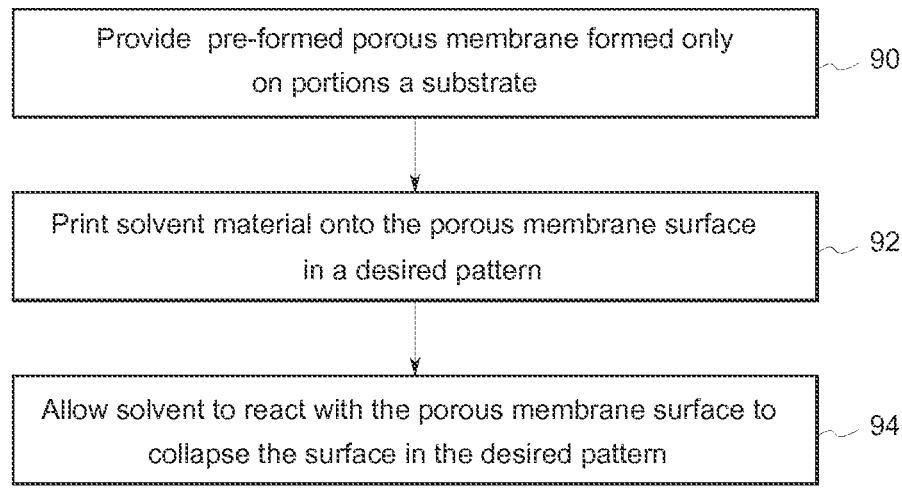
FIG. 9 is a flow diagram of a combination solvent printing and direct printing technique according to an embodiment of the disclosure.

Cast porous membranes may also be further patterned via the solvent printing techniques disclosed herein. FIG. 9 is a flow diagram of a technique for solvent printing a cast porous membrane. At step 90, the method includes providing a substrate including pre-formed or cast porous membrane regions disposed only on certain areas of the substrate and, at step 92, printing solvent material or applying solvent to the porous membrane regions. After allowing the solvent to dry at step 94, the resulting substrate including porous membrane regions with printed patterns as disclosed herein that form boundaries to fluid flow. In this manner, additional complexity may be added to the porous membrane regions.

Figure 10:
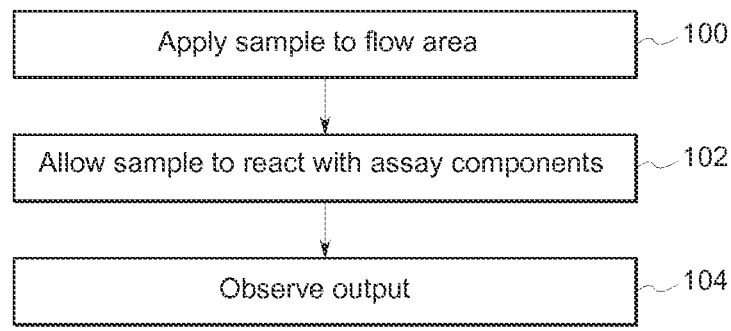
FIG. 10 is a flow diagram of a method of using a porous membrane according to an embodiment of the disclosure.

FIG. 10 is a flow diagram showing a method of use for a porous membrane as provided herein. At step 100, a sample is applied to a fluid flow area, which may be indicated via a visible marker or text indication on the porous membrane. For porous membranes that are formed in sheets including multiple testing units, the porous membrane may be cut prior to use into a single testing strip or unit. Alternatively, the porous membrane may be used in a batch process in which several samples are testing in parallel on a testing sheet including a plurality of testing strips and/or testing patterns. Further, the porous membrane may be used in conjunction with any appropriate cassette or holder.

At step 102, the sample is allowed to flow through the flow area to react with the assay components present in the porous membrane. In certain embodiments, the assay components may include immobilized ligands capable of binding an analyte present in the sample, e.g., via a sandwich assay or a competitive assay. The ligands may bind or be directly coupled to a signal generator that provides an observable output at step 104.

A sample may include any fluid or suspended solid sample suspected of containing an analyte of interest. Samples may represent any body fluid or fluids, an agricultural or other biological sample, or a non-biological fluid, such as an environmental sample.

Technical effects of the invention include a porous membrane with increased complexity and pattern resolution that may facilitate assays with greater complexity. Other technical effects include 3D patterning and/or layering of porous membranes to achieve different morphologies during manufacturing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for patterning a porous membrane, comprising:
   receiving an input comprising a pattern, wherein the pattern defines a closed flow area; and
   controlling a printer to apply a solvent to a surface of a porous membrane in the desired pattern such that the porous membrane collapses where the solvent is applied.

2. The method of claim 1, wherein the pattern is a repeating pattern.

3. The method of claim 1, wherein the pattern comprises at least one collapsed region having a thickness of 0.02 mm to 0.35 mm.

4. The method of claim 1, wherein the flow area comprises at least one branch or arm terminating in a larger reservoir.

5. The method of claim 1, wherein the porous membrane is a nitrocellulose membrane.

6. The method of claim 1, wherein the porous membrane is disposed only on certain portions of a substrate.

* * * * *